(12) United States Patent
Zhou

(10) Patent No.: US 12,745,533 B2
(45) Date of Patent: Sep. 22, 2026

(54) OLED DISPLAY PANEL AND DISPLAY DEVICE INCLUDING COLOR RESIST LAYER

(71) Applicant: Wuhan China Star Optoelectronics Semiconductor Display Technology Co., Ltd., Wuhan (CN)

(72) Inventor: Jing Zhou, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 932 days.

(21) Appl. No.: 17/275,207

(22) PCT Filed: Dec. 28, 2020

(86) PCT No.: PCT/CN2020/140249

§ 371 (c)(1),
(2) Date: Sep. 6, 2023

(87) PCT Pub. No.: WO2022/134135

PCT Pub. Date: Jun. 30, 2022

(65) Prior Publication Data

US 2023/0422584 A1 Dec. 28, 2023

(30) Foreign Application Priority Data

Dec. 25, 2020 (CN) ........................ 202011557699.3

(51) Int. Cl.
*H10K 59/38* (2023.01)
*H10K 59/35* (2023.01)
(Continued)

(52) U.S. Cl.
CPC ............ *H10K 59/38* (2023.02); *H10K 59/35* (2023.02); *H10K 59/40* (2023.02);
(Continued)

(58) Field of Classification Search
CPC ........ H10K 59/38; H10K 59/35; H10K 59/40; H10K 59/8792; H10K 59/80;
(Continued)

(56) References Cited

U.S. PATENT DOCUMENTS 9,406,724 B2 * 8/2016 Choi ...................... H10K 59/35
9,853,093 B2 * 12/2017 Shim .................... H10K 59/879
(Continued)

FOREIGN PATENT DOCUMENTS

CN 101581852 11/2009
CN 104166269 11/2014
(Continued)

*Primary Examiner* — Ida M Soward

(57) ABSTRACT

The present disclosure provides an organic light-emitting diode (OLED) display panel and a display device. The OLED display panel includes a substrate, a light-emitting layer, a black matrix layer, a transparent planarization layer, and a color resist layer. The transparent planarization layer is disposed on the light-emitting layer and at least completely fills openings of the black matrix layer. The color resist layer is disposed on the transparent planarization layer. An orthographic projection of the color resist layer on the substrate partially overlaps an orthographic projection of the black matrix layer on the substrate, so as to prevent a bullhorn phenomenon due to a mutual covering film design between the color resist layer and the black matrix layer.

18 Claims, 4 Drawing Sheets

(51) Int. Cl.

| | |
|---|---|
| ***H10K 59/40*** | (2023.01) |
| ***H10K 59/80*** | (2023.01) |
| *G06F 3/041* | (2006.01) |
| *H10K 50/844* | (2023.01) |
| *H10K 50/86* | (2023.01) |
| *H10K 59/12* | (2023.01) |
| *H10K 59/126* | (2023.01) |

m

(52) U.S. Cl.
CPC ....... *H10K 59/8792* (2023.02); *G06F 3/0412* (2013.01); *H10K 50/844* (2023.02); *H10K 50/865* (2023.02); *H10K 59/12* (2023.02); *H10K 59/126* (2023.02); *H10K 59/80* (2023.02); *H10K 59/873* (2023.02); *H10K 59/877* (2023.02)

(58) Field of Classification Search
CPC .... H10K 59/873; H10K 59/877; H10K 59/12; H10K 59/126; H10K 50/844; H10K 50/865; G06F 3/0412
See application file for complete search history.

(56) References Cited

U.S. PATENT DOCUMENTS

| | | | | |
|---|---|---|---|---|
| 2008/0224963 | A1* | 9/2008 | Takagi | H10K 59/8792 345/76 |
| 2012/0228603 | A1* | 9/2012 | Nakamura | H10K 50/824 257/40 |
| 2015/0084026 | A1* | 3/2015 | Miyamoto | H10K 59/879 257/40 |
| 2016/0233274 | A1 | 8/2016 | Park | |
| 2019/0113800 | A1* | 4/2019 | Mou | G02F 1/133516 |
| 2019/0333975 | A1* | 10/2019 | Ohchi | H10K 59/122 |
| 2020/0395416 | A1 | 12/2020 | Bae et al. | |

FOREIGN PATENT DOCUMENTS

| | | | | | |
|---|---|---|---|---|---|
| CN | 107621723 | | | 1/2018 | |
| CN | 108417612 | | | 8/2018 | |
| CN | 109192758 | | | 1/2019 | |
| CN | 109309170 | | | 2/2019 | |
| CN | 109887931 | | | 6/2019 | |
| CN | 111108602 | A | * | 5/2020 | H10K 59/8792 |
| JP | 2008-077859 | | | 4/2008 | |
| JP | 2008077859 | A | * | 4/2008 | H05B 33/12 |
| JP | 2019133816 | A | * | 8/2019 | H10K 59/10 |
| KR | 20140014684 | A | * | 2/2014 | H10K 59/12 |
| KR | 10-2016-0042679 | | | 4/2016 | |
| WO | WO-2013047621 | A1 | * | 4/2013 | H10K 59/8792 |

* cited by examiner

OLED DISPLAY PANEL AND DISPLAY DEVICE INCLUDING COLOR RESIST LAYER

RELATED APPLICATIONS

This application is a National Phase of PCT Patent Application No. PCT/CN2020/140249 having International filing date of Dec. 28, 2020, which claims the benefit of priority of Chinese Patent Application No. 202011557699.3 filed on Dec. 25, 2020. The contents of the above applications are all incorporated by reference as if fully set forth herein in their entirety.

FIELD AND BACKGROUND OF THE INVENTION

The present disclosure relates to a field of display technologies and particularly to an organic light-emitting diode (OLED) display panel and a display device.

A technology of replacing polarizers with color filters (CF) is one of the key technologies to realize dynamic bending product development. However, compared to the polarizers, the color filters have higher surface reflectivity and lower contrast under strong light, which is not conducive to outdoor display.

The color filters include a black matrix layer (BM) and a color resist layer. In an organic light-emitting diode (OLED) display panel, the color resist layer is mainly configured to correspond to light emission of a sub-pixel unit. The black matrix layer is mainly configured to prevent light leakage from a display panel and reduce reflection from the display panel. However, in a film layer design of the color filters of the prior art, the color resist layer is generally filled openings of the black matrix layer and overlaps the black matrix layer. This kind of film layer design is likely to cause bullhorn phenomenon during display. The bullhorn phenomenon will greatly affect light-emitting angles of the display panel.

In summary, there is an urgent need to provide an OLED display panel and a display device to solve the above-mentioned technical problems.

SUMMARY OF THE INVENTION

Technical Problem

The present disclosure provides an organic light-emitting diode (OLED) display panel and a display device to solve the bullhorn phenomenon causing by a color resist layer overlapping a black matrix layer in a film layer design of a color filter.

Technical Solution

To solve the above technical problems, the technical solutions provided by the disclosure as follows.

The disclosure provides an OLED display panel, including:

a substrate;

a light-emitting layer disposed on the substrate and including a plurality of light-emitting pixels;

a black matrix layer disposed on the light-emitting layer and defined a plurality of openings corresponding to the light-emitting pixels;

a transparent planarization layer disposed on the light-emitting layer and at least completely filling the openings, wherein a thickness of the transparent planarization layer ranges from 1 um to 5 um; and a color resist layer disposed on the transparent planarization layer and corresponding to the light-emitting pixels, wherein an orthographic projection of the color resist layer on the substrate partially overlaps an orthographic projection of the black matrix layer on the substrate, and the color resist layer completely covers regions corresponding to corresponding to the openings.

In the OLED display panel provided by an embodiment of the present disclosure, the transparent planarization layer is completely filled in the openings of the black matrix layer and covers a surface of the black matrix layer away from the substrate.

In the OLED display panel provided by an embodiment of the present disclosure, a plurality of light scattering particles are doped in the transparent planarization layer.

In the OLED display panel provided by an embodiment of the present disclosure, the light scattering particles includes one or more of silicon dioxide, titanium dioxide, zinc oxide, and zirconium dioxide.

In the OLED display panel provided by an embodiment of the present disclosure, the OLED display panel further includes an encapsulation layer disposed on the light-emitting layer, and the black matrix layer and the transparent planarization layer are disposed on the encapsulation layer.

In the OLED display panel provided by an embodiment of the present disclosure, the OLED display panel further includes an insulating layer disposed on the encapsulation layer and a touch structure disposed on the insulating layer, and the black matrix layer and the transparent planarization layer are disposed on the touch structure.

In the OLED display panel provided by an embodiment of the present disclosure, the touch structure includes a touch layer and a passivation layer, the touch layer is disposed on the insulating layer, the passivation layer is disposed on the insulating layer and covers the touch layer, and the black matrix layer and the transparent planarization layer are disposed on the passivation layer.

In the OLED display panel provided by an embodiment of the present disclosure, the touch structure includes a touch layer disposed on the insulating layer, the black matrix layer is disposed on the insulating layer and covers the touch layer, and the transparent planarization layer is disposed on the insulating layer.

In the OLED display panel provided by an embodiment of the present disclosure, the transparent planarization layer is made from an over-coating.

The disclosure further provides another OLED display panel, including:

a substrate;

a light-emitting layer disposed on the substrate and including a plurality of light-emitting pixels;

a black matrix layer disposed on the light-emitting layer and defined a plurality of openings corresponding to the light-emitting pixels;

a transparent planarization layer disposed on the light-emitting layer and at least completely filling the openings; and a color resist layer disposed on the transparent planarization layer and corresponding to the light-emitting pixels, wherein an orthographic projection of the color resist layer on the substrate partially overlaps an orthographic projection of the black matrix layer on the substrate.

In the OLED display panel provided by an embodiment of the present disclosure, the transparent planarization layer completely fills the opening of the black matrix layer and covers a surface of the black matrix layer away from the substrate.

In the OLED display panel provided by an embodiment of the present disclosure, a plurality of light scattering particles are doped in the transparent planarization layer.

In the OLED display panel provided by an embodiment of the present disclosure, the light scattering particles comprise one or more of silicon dioxide, titanium dioxide, zinc oxide, and zirconium dioxide.

In the OLED display panel provided by an embodiment of the present disclosure, the OLED display panel further includes an encapsulation layer disposed on the light-emitting layer, and the black matrix layer and the transparent planarization layer are disposed on the encapsulation layer.

In the OLED display panel provided by an embodiment of the present disclosure, the OLED display panel further includes an insulating layer disposed on the encapsulation layer and a touch structure disposed on the insulating layer, and the black matrix layer and the transparent planarization layer are disposed on the touch structure.

In the OLED display panel provided by an embodiment of the present disclosure, the touch structure includes a touch layer and a passivation layer, the touch layer is disposed on the insulating layer, the passivation layer is disposed on the insulating layer and covers the touch layer, and the black matrix layer and the transparent planarization layer are disposed on the passivation layer.

In the OLED display panel provided by an embodiment of the present disclosure, the touch structure includes a touch layer disposed on the insulating layer, the black matrix layer is disposed on the insulating layer and covers the touch layer, and the transparent planarization layer is disposed on the insulating layer.

In the OLED display panel provided by an embodiment of the present disclosure, a thickness of the transparent planarization layer ranges from 1 um to 5 um.

In the OLED display panel provided by an embodiment of the present disclosure, the color resist layer completely covers regions corresponding to the openings.

The disclosure further provides a display device, and the display device includes the OLED display panel above-mentioned.

Beneficial Effect

The beneficial effects of the present application are: the OLED display panel and the display device provided by the present disclosure are provided with a transparent planarization layer on the light-emitting layer, the transparent planarization layer at least fills the opening of the black matrix layer, and the color resist layer is disposed on the transparent planarization layer, so that the surface of the black matrix layer away from the substrate is flat, and the surface of the color resist layer facing the substrate is flat, so as to prevent the OLED display panel from generating a bullhorn phenomenon during the display due to the mutual covering film design between the color resist layer and the black matrix layer, and which is beneficial to optimize a chromaticity viewing angle of the color resist layer, to ensure the OLED display panel has a low reflectivity in a screen-off state, and to improve a contrast of the OLED display panel.

BRIEF DESCRIPTION OF THE SEVERAL VIEWS OF THE DRAWINGS

In order to explain embodiments or technical solutions in the prior art more clearly, the following will briefly introduce drawings involved in a following description of the embodiments or the prior art. Obviously, the drawings in the following description are merely inventions. Those of ordinary skill in the art can obtain other drawings based on these drawings without creative work.

DESCRIPTION OF SPECIFIC EMBODIMENTS OF THE INVENTION

Reference will now be made in detail to embodiments, examples of which are illustrated in the accompanying drawings. In description of the disclosure, it should be understood that orientational relationships represented by directional terms mentioned in the present disclosure, such as up, down, front, rear, left, right, inside, outside, side surface, etc., are orientational relationships based on the drawings, and are merely for the convenience of describing the present disclosure and simplifying the description, and should not be interpreted as a limitation of the application. Wherein, same or similar reference numbers always represent same or similar elements or elements with same or similar functions.

The present disclosure aims at the technical problem that the organic light-emitting diode (OLED) display panel and the display device in the prior art may have a bullhorn phenomenon during display due to the mutual covering film design between the color resist layer and the black matrix layer, which greatly affects the light-emitting angles. This present disclosure can solve this defect.

Figure 1:
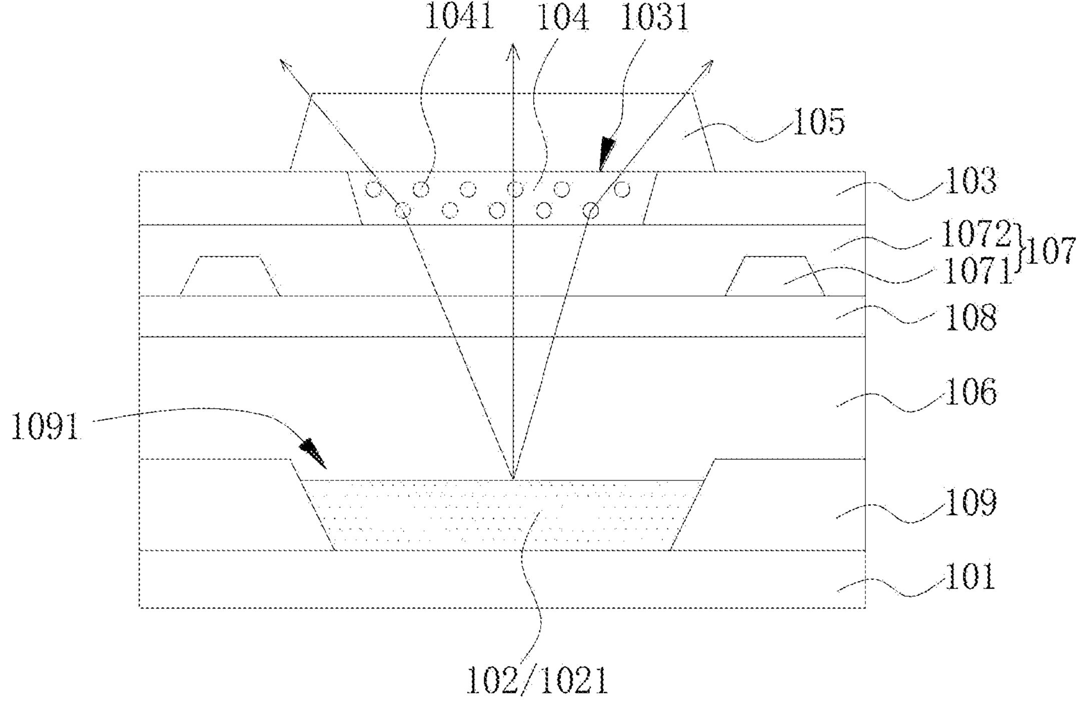
FIG. 1 is a structural schematic view of a first organic light-emitting diode (OLED) display panel according to an embodiment of the present disclosure.
Figure 2:
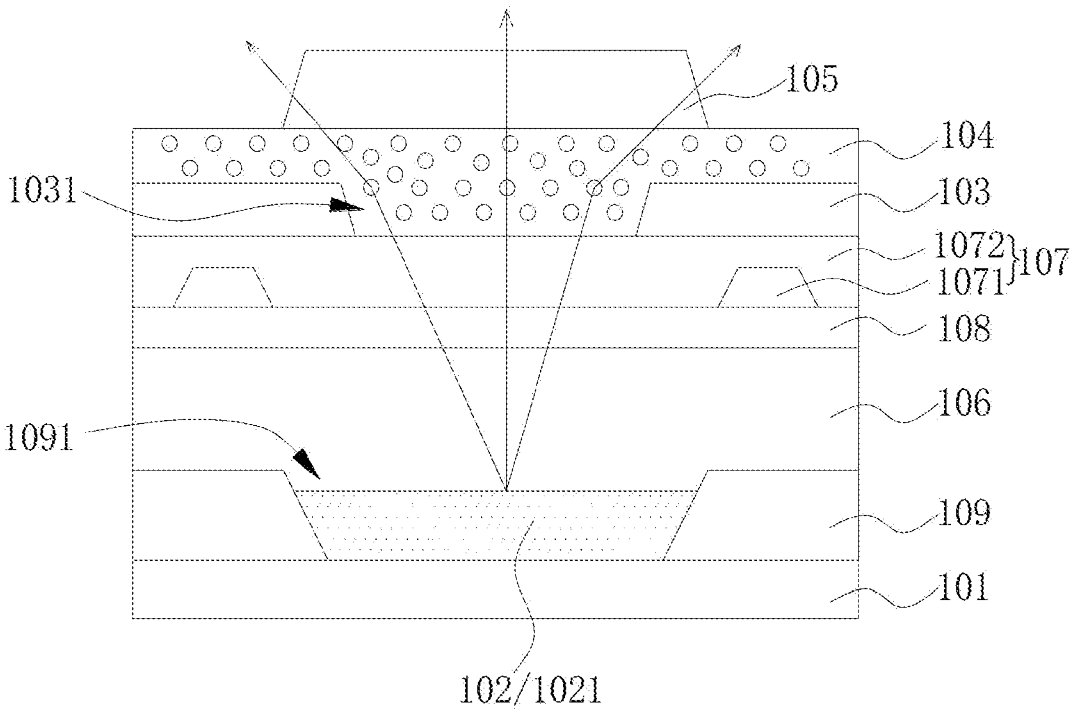
FIG. 2 is a structural schematic view of a second OLED display panel according to an embodiment of the present disclosure.

Please refer to FIG. 1 and FIG. 2. FIG. 1 and FIG. 2 show an OLED display panel. The OLED display panel includes a substrate 101, a light-emitting layer 102, a black matrix layer 103, a transparent planarization layer 104, and a color resist layer 105.

The light-emitting layer 102 is disposed on the substrate 101 and includes a plurality of light-emitting pixels 1021. The black matrix layer 103 is disposed on the light-emitting layer 102 to prevent light leakage of the OLED display panel and reduce reflectivity of the OLED display panel. At least one opening 1031 is defined in the black matrix layer 103 corresponding to the light-emitting pixels 1021. The transparent planarization layer 104 is disposed on the light-emitting layer 102 and at least completely fills the at least one opening 1031. The color resist layer 105 is disposed on the transparent planarization layer 104 and corresponds to the light-emitting pixels 1021. An orthographic projection of the color resist layer 105 on the substrate 101 partially overlaps an orthographic projection of the black matrix layer 103 on the substrate 101.

Specifically, the substrate 101 may be a flexible substrate, such as a polyimide (PI) substrate. The light-emitting pixels 1021 include red light-emitting pixels, green light-emitting pixels, and blue light-emitting pixels for emitting light of corresponding colors. The color resist layer 105 is arranged corresponding to the light-emitting pixels 1021 to make light emitted by the light-emitting pixels 1021 enter the color resist layer 105 and then exit from the color resist layer 105. The color resist layer 105 at least includes a red color resist layer, a green color resist layer, and a blue color resist layer. Wherein, the red color resist layer is arranged corresponding to the red light-emitting pixels, the green color resist layer is arranged corresponding to the green light-emitting pixels, and the blue color resist layer is arranged corresponding to the blue light-emitting pixels.

Specifically, the color resist layer 105 completely covers an area planarization layer corresponding to the openings 1031, so that all the light emitted by the light-emitting layer 102 enters the color resist layer 105.

Specifically, a material of the black matrix layer 103 may include black organic resin and black inorganic thin film materials. The black inorganic thin film materials include metal oxides and metal sulfides, such as CuO, $Fe_2O_3$, $MnO_2$, $Fe_2O_3$, MoS, CuS, and other relatively stable metal oxides and metal sulfides.

Please refer to FIG. 1, in an embodiment of the present disclosure, the transparent planarization layer 104 completely fills the opening 1031 of the black matrix layer 103. The color resist layer 105 covers the transparent planarization layer 104 and a portion of the black matrix layer 103. In this case, the transparent planarization layer 104 causes a surface of the black matrix layer 103 away from the substrate 101 and a surface of the transparent planarization layer 104 away from the substrate 101 to be on a same plane, so that a surface of the later disposed color resist layer 105 facing the substrate 101 is flat. That is, a thickness of the color resist layer 105 at each position remains the same, which can eliminate difference in thickness, so as to prevent the OLED display panel from generating a bullhorn phenomenon during display due to a mutual covering film design between the color resist layer 105 and the black matrix layer 103, which is conducive to increasing transmittance of light in the color resist layer 105, optimizing chromaticity viewing angles of the color resist layer 105 and further preventing overall viewing angles of the OLED display panel from deteriorating as a result of reduced transmittance of light in the color resist layer 105.

Specifically, in this embodiment of the disclosure, the transparent planarization layer 104 may be formed by inkjet printing on the light-emitting layer 102.

In another embodiment of this disclosure, as shown in FIG. 2, differences between FIG. 2 and FIG. 1 are that the transparent planarization layer 104 completely fills the opening 1031 of the black matrix layer 103 and covers a surface of the black matrix layer 103 away from the substrate 101, and the color resist layer 105 is completely disposed on the transparent planarization layer 104. In this case, the transparent planarization layer 104 can prevent the color resist layer 105 from directly covering the openings 1031. Since the transparent planarization layer 104 has a flat surface away from the substrate 101, so that a surface of the later disposed color resist layer 105 facing the substrate 101 is flat. That is, a thickness of the color resist layer 105 at each position remains the same, which can eliminate difference in thickness, so as to prevent the OLED display panel from generating a bullhorn phenomenon during display due to a mutual covering film design between the color resist layer 105 and the black matrix layer 103, which is conducive to increasing transmittance of light in the color resist layer 105, optimizing chromaticity viewing angles of the color resist layer 105 and further preventing overall viewing angles of the OLED display panel from deteriorating as a result of reduced transmittance of light in the color resist layer 105.

Specifically, a thickness of the transparent planarization layer 104 ranges from 1 um to 5 um.

Specifically, in this embodiment of the disclosure, the transparent planarization layer 104 can be formed by processes such as deposition, coating, or sputtering.

It can be understood that because the bullhorn phenomenon of the color resist layer 105 is resolved, an overall surface structure of the OLED display panel without bullhorn phenomenon is more simplified than the OLED display panel with bullhorn phenomenon, which is beneficial to attachment of subsequent modules (such as cover plates). When the subsequent modules are bonded to the OLED display panel through optically clear adhesive (OCA), tiny bubbles between the optical adhesive and the OLED display panel will be reduced, reducing reflectivity of the OLED display panel, so as to ensure that the OLED display panel has a low reflectivity in a screen-off state, and the contrasts of the OLED display panel in a normal use state (where there is ambient light), a screen-on state (display state), and the screen-off state (display brightness is set to 0) are improved.

Further, as shown in FIGS. 1 and 2, the transparent planarization layer 104 may also be doped with a plurality of light scattering particles 1041. When light emitted by the light-emitting layer 102 passes through the transparent planarization layer 104, the light is scattered among the light-scattering particles 1041, so that light-emitting viewing angles can be increased. The plurality of the light scattering particles 1041 are uniformly distributed in the transparent planarization layer 104 to improve uniformity of light emission.

The plurality of light scattering particles 1041 may be distributed in each area of the transparent planarization layer 104, or may only be distributed in part of the transparent planarization layer 104. For example, as shown in FIG. 3, the plurality of light scattering particles 1041 are arranged corresponding to the color resist layer 105 to prevent excessive light emission angles causing the light emitted by the light-emitting layer 102 to enter the color resist layer 105 after being emitted from the transparent planarization layer 104, thereby preventing color mixing.

Specifically, the light scattering particles 1041 comprise one or more of silicon dioxide, titanium dioxide, zinc oxide, and zirconium dioxide.

Specifically, the transparent planarization layer is made of an over-coating (OC) material. The OC material may be epoxy resin. For example, the OC material may be gel coat resin.

Figure 3:
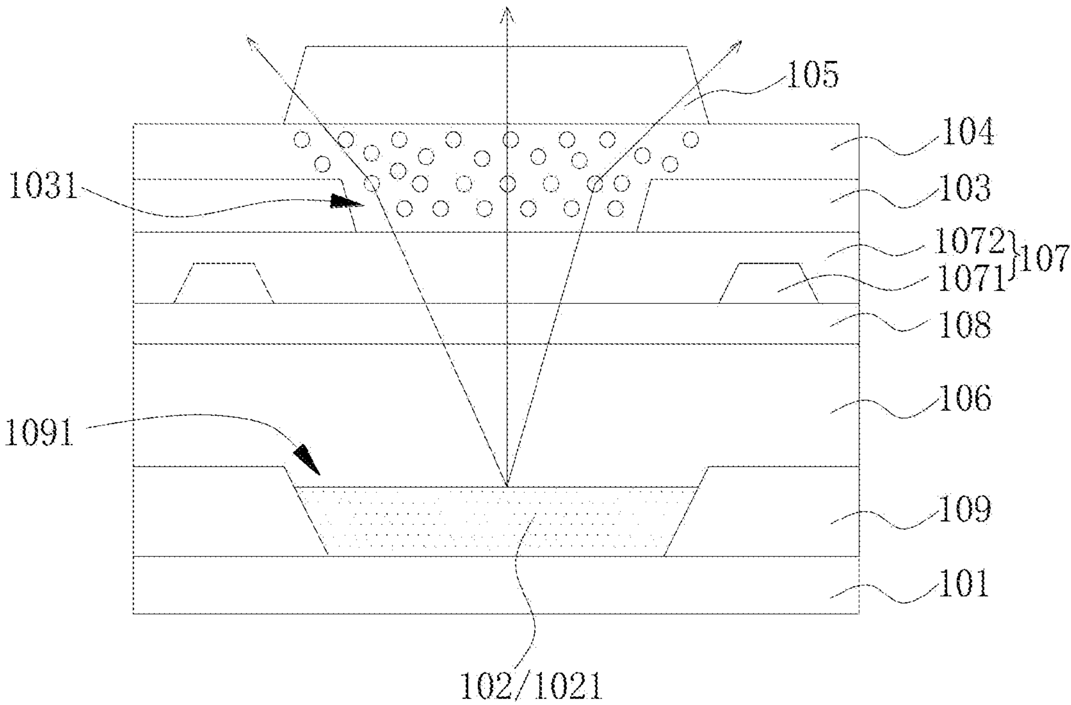
FIG. 3 is a structural schematic view of a third OLED display panel according to an embodiment of the present disclosure.

As shown in FIGS. 1, 2, and 3, the OLED display panel further includes an encapsulation layer 106. The encapsulation layer 106 is disposed on the light-emitting layer. The encapsulation layer 106 is configured to encapsulate the light-emitting layer to protect the light-emitting layer 102 from being corroded by external moisture and oxygen. Considering that there may be process difficulties in preparing the encapsulation layer 106 that is too thick, the encapsulation layer 106 in this embodiment of the present disclosure may adopt an alternately stacked structure of inorganic layer and organic layer. For example, the encapsulation layer 106 may include a first inorganic encapsulation layer, an organic encapsulation layer, and a second inorganic encapsulation layer sequentially disposed on the light-emitting layer 102. Specifically, materials of the first inorganic encapsulation layer and the second inorganic encapsulation layer may include at least one of silicon nitride or silicon oxynitride. The first inorganic encapsulation layer and the second inorganic encapsulation layer are generally made by atomic layer deposition. A material of the organic encapsulation layer may include one of resins and silicone organics such as acrylic resin, epoxy resin, and silicone. The organic encapsulation layer is generally formed by inkjet printing.

The OLED display panel further includes a touch structure 107 and an insulating layer 108. The insulating layer 108 is disposed on the encapsulation layer 106. The touch structure 107 is disposed on the insulating layer 108. The black matrix layer 103 and the transparent planarization layer 104 are disposed on the touch structure 107. Specifically, a material of the insulating layer 108 may be an inorganic material such as silicon nitride or silicon oxide.

The touch structure 107 includes a touch layer 1071 and a passivation layer 1072. In this embodiment, the touch layer 1071 is a direct cell touch (DOT) layer on the screen. The touch layer 1071 is disposed on the insulating layer 108. The passivation layer 1072 is disposed on the touch layer 1071. The black matrix layer 103 and the transparent planarization layer 104 are disposed on the passivation layer 1072.

Specifically, the passivation layer 1072 is disposed on the insulating layer 108, covers the touch layer 1071, and is configured to realize planarization of the touch layer 1071 and prevent water vapor from damaging the touch layer 1071. Specifically, a material of the passivation layer 1072 may be an inorganic material, such as silicon nitride or silicon oxide.

It should be noted that in this embodiment the touch structure 107 is integrated on the insulating layer 108 disposed on the encapsulation layer 106, such that there is no need to add a separate external touch layer, allowing the OLED display panel to have better transmittance and bending resistance and effectively reducing a thickness of the OLED display panel, thereby reducing product costs.

Figure 4:
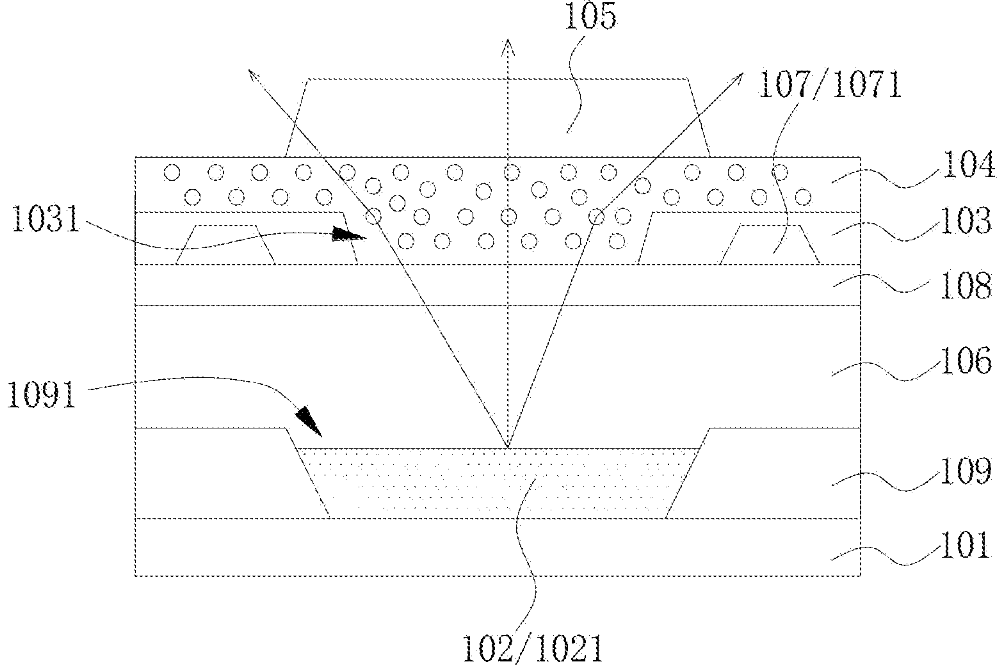
FIG. 4 is a structural schematic view of a fourth OLED display panel according to an embodiment of the present disclosure.

Further, as shown in FIG. 4, a difference between FIG. 4 and FIG. 2 is that the touch structure 107 in FIG. 4 only includes the touch layer 1071 and does not include a passivation layer 1072. The touch layer 1071 is disposed on the insulating layer 108, the black matrix layer 103 is disposed on the insulating layer 108 and covers the touch layer 1071, and the transparent planarization layer 104 is disposed on the insulating layer 108. In this embodiment, the black matrix layer 103 is configured to replace the passivation layer 1072 disposed on the touch layer 1071, and the black matrix layer 103 can also serve to planarize the touch layer 1071. Owing to the omission of the passivation layer 1072, the thickness of the OLED display panel is reduced, so that a propagation distance of light emitted by the light-emitting layer 102 in the film layer before entering the color resist layer 105 is further shortened, thereby further optimizing viewing angles.

It should be noted that the OLED display panel further includes a thin film transistor array layer (not shown in the figures) disposed on the substrate 101, a pixel definition layer 109, and a light emitting device layer. A plurality of grooves 1091 are defined in the pixel definition layer 109, and the light-emitting layer 102 is disposed in the grooves 1091. The light-emitting device layer includes the light-emitting layer 102, an anode layer, a hole injection layer, a hole transport layer, an electron transport layer, an electron injection layer, and a cathode layer disposed on the thin film transistor array layer. Since this is a prior art, it will not be repeated here.

The disclosure further provides a display device. The display device includes the OLED display panel in the foregoing embodiments. The display device may be a wearable device, such as a smart bracelet, a smartwatch, or virtual reality (VR) equipment, etc., and can also be mobile smartphones, e-books or e-newspapers, televisions, personal laptop computers, foldable or rollable flexible OLED displays, or lighting equipment.

The beneficial effects of the present application are: the OLED display panel and the display device provided by the present disclosure are provided with a transparent planarization layer on the light-emitting layer, the transparent planarization layer at least fills the openings of the black matrix layer, and the color resist layer is disposed on the transparent planarization layer, so that the surface of the black matrix layer away from the substrate is flat, and the surface of the color resist layer facing the substrate is flat, so as to prevent the OLED display panel from generating a bullhorn phenomenon during display due to the mutual covering film design between the color resist layer and the black matrix layer, which in turn optimizes chromaticity viewing angles of the color resist layer, ensures that the OLED display panel has a low reflectivity in a screen-off state, and increases contrast of the OLED display panel.

The foregoing embodiments are merely some embodiments of the present disclosure, and descriptions thereof are relatively specific and detailed. However, it should not be understood as a limitation to the patent scope of the present disclosure. It should be noted that, a person of ordinary skill in the art may further make some variations and improvements without departing from the concept of the present disclosure, and the variations and improvements belong to the protection scope of the present disclosure. Therefore, the protection scope of the present disclosure shall be subject to the protection scope of the appended claims.

What is claimed is:

1. An organic light-emitting diode (OLED) display panel, comprising:

a substrate;

a light-emitting layer disposed on the substrate and comprising a plurality of light-emitting pixels;

a black matrix layer disposed on the light-emitting layer and defined with a plurality of openings corresponding to the plurality of light-emitting pixels;

a transparent planarization layer disposed on the light-emitting layer and at least completely filling the plurality of openings, wherein a thickness of the transparent planarization layer ranges from 1 μm to 5 μm; and a color resist layer disposed on the transparent planarization layer corresponding to the plurality of light-emitting pixels, wherein an orthographic projection of the color resist layer on the substrate partially overlaps an orthographic projection of the black matrix layer on the substrate, and the color resist layer completely covers regions corresponding to the plurality of openings;

wherein the transparent planarization layer completely fills the plurality of openings of the black matrix layer and covers a surface of the black matrix layer away from the substrate.

2. The OLED display panel in claim 1, wherein a plurality of light scattering particles are doped in the transparent planarization layer.

3. The OLED display panel in claim 2, wherein the plurality of light scattering particles comprise one or more of silicon dioxide, titanium dioxide, zinc oxide, and zirconium dioxide.

4. The OLED display panel in claim 1, further comprising an encapsulation layer disposed on the light-emitting layer, wherein the black matrix layer and the transparent planarization layer are disposed on the encapsulation layer.

5. The OLED display panel in claim 4, further comprising a touch structure and an insulating layer, the insulating layer is disposed on the encapsulation layer, the touch structure is disposed on the insulating layer, and the black matrix layer and the transparent planarization layer are disposed on the touch structure.

6. The OLED display panel in claim 5, wherein the touch structure comprises a touch layer and a passivation layer, the touch layer is disposed on the insulating layer, the passivation layer is disposed on the insulating layer and covers the touch layer, and the black matrix layer and the transparent planarization layer are disposed on the passivation layer.

7. The OLED display panel in claim 5, wherein the touch structure comprises a touch layer disposed on the insulating layer, the black matrix layer is disposed on the insulating layer and covers the touch layer, and the transparent planarization layer is disposed on the insulating layer.

8. The OLED display panel in claim 1, wherein the transparent planarization layer is made from a high gloss coating material.

9. An OLED display panel, comprising:

a substrate;

a light-emitting layer disposed on the substrate and comprising a plurality of light-emitting pixels;

a black matrix layer disposed on the light-emitting layer and defined with a plurality of openings corresponding to the plurality of light-emitting pixels;

a transparent planarization layer disposed on the light-emitting layer and at least completely filling the plurality of openings; and a color resist layer disposed on the transparent planarization layer corresponding to the plurality of light-emitting pixels, wherein an orthographic projection of the color resist layer on the substrate partially overlaps an orthographic projection of the black matrix layer on the substrate;

wherein the transparent planarization layer completely fills the plurality of openings of the black matrix layer and covers a surface of the black matrix layer away from the substrate.

10. The OLED display panel in claim 9, wherein a plurality of light scattering particles are doped in the transparent planarization layer.

11. The OLED display panel in claim 10, wherein the plurality of light scattering particles comprise one or more of silicon dioxide, titanium dioxide, zinc oxide, and zirconium dioxide.

12. The OLED display panel in claim 9, further comprising an encapsulation layer disposed on the light-emitting layer, wherein the black matrix layer and the transparent planarization layer are disposed on the encapsulation layer.

13. The OLED display panel in claim 12, further comprising a touch structure and an insulating layer, the insulating layer is disposed on the encapsulation layer, the touch structure is disposed on the insulating layer, and the black matrix layer and the transparent planarization layer are disposed on the touch structure.

14. The OLED display panel in claim 13, wherein the touch structure comprises a touch layer and a passivation layer, the touch layer is disposed on the insulating layer, the passivation layer is disposed on the insulating layer and covers the touch layer, and the black matrix layer and the transparent planarization layer are disposed on the passivation layer.

15. The OLED display panel in claim 13, wherein the touch structure comprises a touch layer disposed on the insulating layer, the black matrix layer is disposed on the insulating layer and covers the touch layer, and the transparent planarization layer is disposed on the insulating layer.

16. The OLED display panel in claim 9, wherein a thickness of the transparent planarization layer ranges from 1 μm to 5 μm.

17. The OLED display panel in claim 9, wherein the color resist layer completely covers regions corresponding to the plurality of openings.

18. A display device, comprising the OLED display panel according to claim 9.

* * * * *